(12) United States Patent
Kobayashi et al.

(10) Patent No.: US 9,252,353 B2
(45) Date of Patent: Feb. 2, 2016

(54) PIEZOELECTRIC ELEMENT, LIQUID EJECTING HEAD, LIQUID EJECTING APPARATUS, AND SENSOR

(71) Applicant: SEIKO EPSON CORPORATION, Tokyo (JP)

(72) Inventors: Tomokazu Kobayashi, Shiojiri (JP); Koichi Morozumi, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/671,292

(22) Filed: Mar. 27, 2015

(65) Prior Publication Data

US 2015/0280103 A1   Oct. 1, 2015

(30) Foreign Application Priority Data

Mar. 31, 2014   (JP) ................. 2014-071237

(51) Int. Cl.
  B41J 2/045  (2006.01)
  H01L 41/08  (2006.01)
  H01L 41/047  (2006.01)
  B41J 2/14  (2006.01)
  G01L 1/16  (2006.01)

(52) U.S. Cl.
  CPC ......... *H01L 41/0815* (2013.01); *B41J 2/14201* (2013.01); *G01L 1/16* (2013.01); *H01L 41/0477* (2013.01)

(58) Field of Classification Search
  CPC .................... B41J 2/14201; H01L 41/187
  See application file for complete search history.

(56) References Cited

U.S. PATENT DOCUMENTS

2009/0077782 A1* 3/2009 Takabe ............ 29/25.35
2014/0210915 A1* 7/2014 Isshiki ............... 347/71

FOREIGN PATENT DOCUMENTS

| JP | 2005-340428 | 12/2005 |
| JP | 2011-238774 | 11/2011 |
| JP | 2012-006182 | 1/2012 |
| JP | 2014-146772 | 8/2014 |

* cited by examiner

*Primary Examiner* — Geoffrey Mruk
(74) *Attorney, Agent, or Firm* — Workman Nydegger

(57) ABSTRACT

A piezoelectric element includes a first electrode; a seed layer comprised of a composite oxide having a perovskite structure and preferentially oriented to a (100) plane, the seed layer including bismuth in an A site and including iron and titanium in a B site, the seed layer having a thickness of less than 20 nm; a piezoelectric layer provided on the seed layer, the piezoelectric layer consisting of a piezoelectric material having a perovskite structure and preferentially oriented to a (100) plane; and a second electrode provided on the piezoelectric layer.

9 Claims, 11 Drawing Sheets

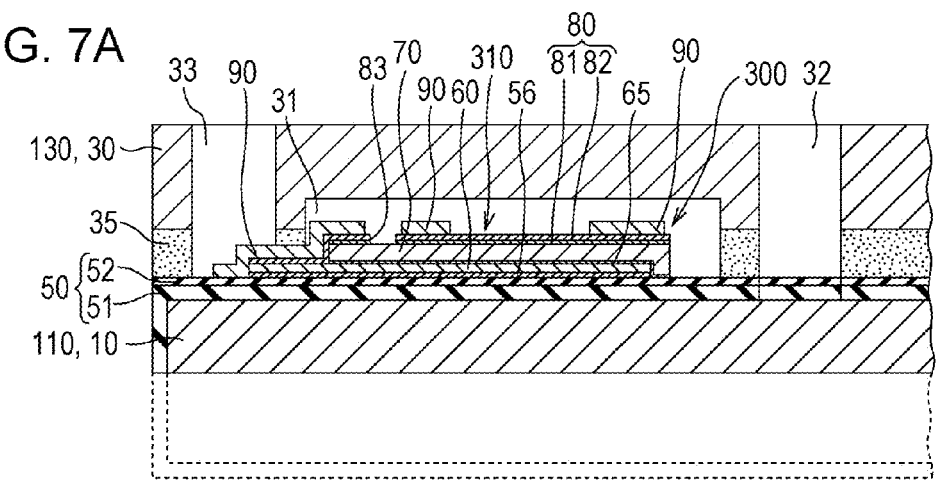
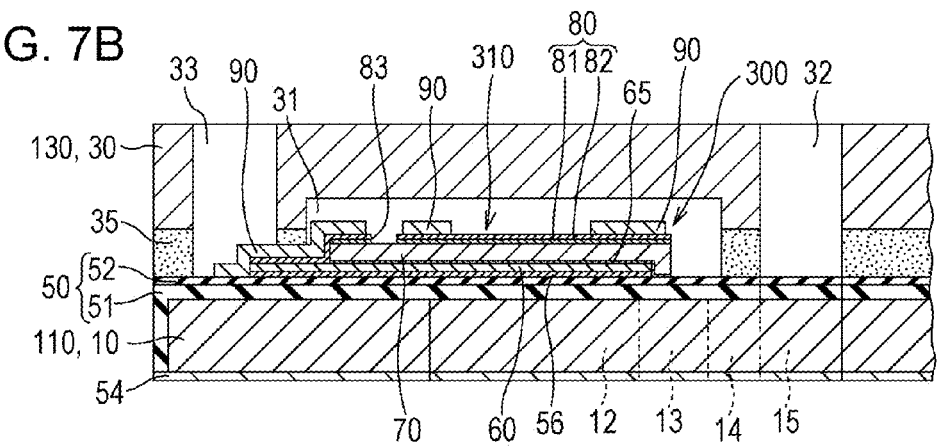
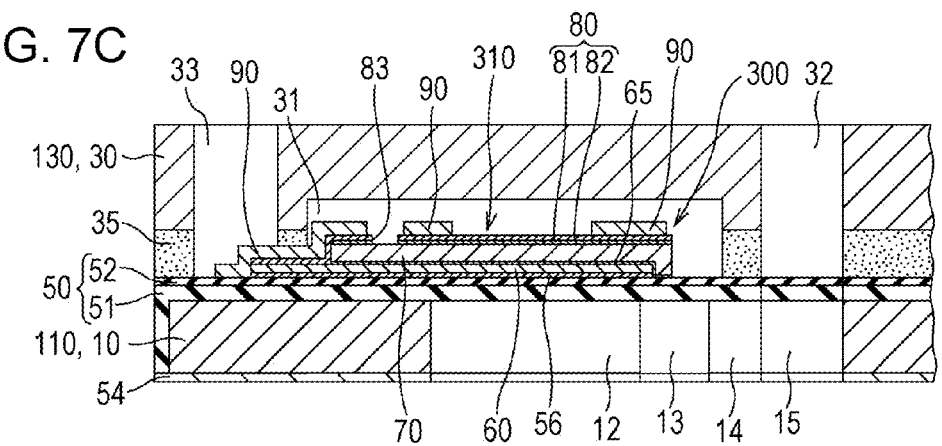

PIEZOELECTRIC ELEMENT, LIQUID EJECTING HEAD, LIQUID EJECTING APPARATUS, AND SENSOR

BACKGROUND

1. Technical Field

The present invention relates to a piezoelectric element, a liquid ejecting head, a liquid ejecting apparatus, and a sensor.

2. Related Art

It is desired that a piezoelectric element used for an ink jet type recording head or the like which is known as a typical example of a liquid ejecting head is preferentially oriented to a (100) plane when the crystal system is a rhombohedral crystal in order to substantively enhance the piezoelectric characteristics of a piezoelectric layer. Moreover, for example, in order to preferentially orient lead zirconate titanate (PZT) to the (100) plane, a method of manufacturing a piezoelectric element in which the piezoelectric layer consisting of lead zirconate titanate is formed on a lower part of an electrode through a lead titanate layer, is disclosed (for example, refer to JP-A-2011-238774). In addition, a technique in which a lanthanum nickel oxide (LNO) is used as a seed layer and a bismuth ferrate-based and bismuth titanate-based piezoelectric layer is preferentially oriented to the (100) plane, is disclosed (for example, refer to JP-A-2012-006182). Furthermore, a technique in which a buffer layer configured from a metal element which can form a B site of a PZT crystal is preferentially oriented to the (100) plane as a seed layer, has been proposed (for example, refer to JP-A-2005-340428).

By using such a seed layer, it becomes possible to effectively orient the piezoelectric layer to the (100) plane. However, a problem in which, when the piezoelectric element is driven, the voltage is distributed to the seed layer and the voltage which is applied to the piezoelectric layer drops, and thus a displacement amount of the piezoelectric element is decreased, occurs.

Meanwhile, such a problem exists not only in an ink jet type recording head, similarly, but also, naturally, in other liquid ejecting heads which discharge liquid droplets other than an ink and, in addition, similarly exists in the piezoelectric element or a piezoelectric actuator used instead of the liquid ejecting head.

SUMMARY

An advantage of some aspects of the invention is to provide a piezoelectric element in which it is possible to preferentially orient a piezoelectric layer to a (100) plane and enhance a displacement amount using a seed layer which can reduce an effect of voltage drop to an applied voltage, a liquid ejecting head provided with the piezoelectric element, a liquid ejecting apparatus, and a sensor.

According to an aspect of the invention, there is provided a piezoelectric element including a first electrode; a seed layer comprised of a composite oxide having a perovskite structure and preferentially oriented to a (100) plane, the seed layer including bismuth in an A site and including iron and titanium in a B site, the seed layer having a thickness of less than 20 nm; a piezoelectric layer provided on the seed layer, the piezoelectric layer consisting of a piezoelectric material having a perovskite structure and preferentially oriented to a (100) plane; and a second electrode provided on the piezoelectric layer.

According to the aspect, by arranging the seed layer which has a perovskite structure and is preferentially oriented to the (100) plane in which the A site includes bismuth and the B site includes iron and titanium, the piezoelectric layer on the seed layer can be preferentially oriented to the (100) plane. In addition, since the seed layer is thin as less than 20 nm, a voltage distribution to the seed layer is reduced, and thus the piezoelectric element in which the displacement amount is enhanced can be realized.

In addition, it is preferable that the seed layer is provided in an island shape. Here, the seed layer can be formed into a film shape or an island shape by controlling a dilution rate or a calcining condition of a material solution, an island shape means a state in which an entire surface is not formed into a film due to aggregation or the like and a crystal separately or independently exists, and the occupancy rate of the seed layer in a case of an island shape is preferably 30% or more and more preferably 60% or more, with respect to the face of the piezoelectric layer which is covered. It is considered that when the occupancy rate is 30% or more, the orientation control function is enhanced, and when the occupancy rate is 60% or more, this occupancy rate contributes to an enhancement of the crystallinity of the piezoelectric layer. Accordingly, the voltage distribution to the seed layer is further reduced, and thus the piezoelectric element in which the displacement amount is further enhanced can be realized.

Here, it is preferable that the first electrode includes platinum preferentially oriented to a (111) plane and a half value width of a diffraction peak derived from the (111) plane by an X-ray diffraction method is 10° or less. Accordingly, the piezoelectric layer preferentially oriented to the (100) plane can be provided on platinum preferentially oriented to the (111) plane.

Here, it is preferable that the molar ratio of bismuth at the A site to iron and titanium at the B site (bismuth/(iron and titanium)) is from 1.0 to 1.4 (bismuth:iron and titanium=1.0:1.0 to 1.4:1.0). Accordingly, the composition of the composite oxide configuring the seed layer becomes optimum and the piezoelectric layer can be surely preferentially oriented to the (100) plane.

Here, it is preferable that the molar ratio of iron to titanium at the B site (iron/titanium) is from 9/11 to 3.0 (iron:titanium=9:11 to 9:3). Accordingly, the molar ratio of iron to titanium at the B site becomes optimum and the piezoelectric layer can be more surely preferentially oriented to the (100) plane.

In addition, according to another aspect of the invention, there is provided a liquid ejecting head provided with the piezoelectric element of the aspect described above. According to the aspect, since the liquid ejecting head is provided with the piezoelectric element in which the displacement amount is enhanced, the liquid ejecting head excellent in discharge characteristics can be realized.

In addition, according to still another aspect in the invention, there is provided a liquid ejecting apparatus provided with the liquid ejecting head of the aspect described above. According to the aspect, the liquid ejecting apparatus provided with the liquid ejecting head in which the displacement amount is enhanced and which is excellent in discharge characteristics can be realized.

In addition, according to still another aspect in the invention, there is provided a sensor provided with piezoelectric element of the aspect described above. According to the aspect, since the sensor is provided with the piezoelectric element in which the displacement amount is enhanced, the sensor excellent in detection sensitivity can be realized.

BRIEF DESCRIPTION OF THE DRAWINGS

The invention will be described with reference to the accompanying drawings, wherein like numbers reference like elements.

FIGS. 7A, 7B, and 7C are cross-section views illustrating a manufacturing process of a recording head according Embodiment 1.

DESCRIPTION OF EXEMPLARY EMBODIMENTS

Embodiment 1

Figure 1:
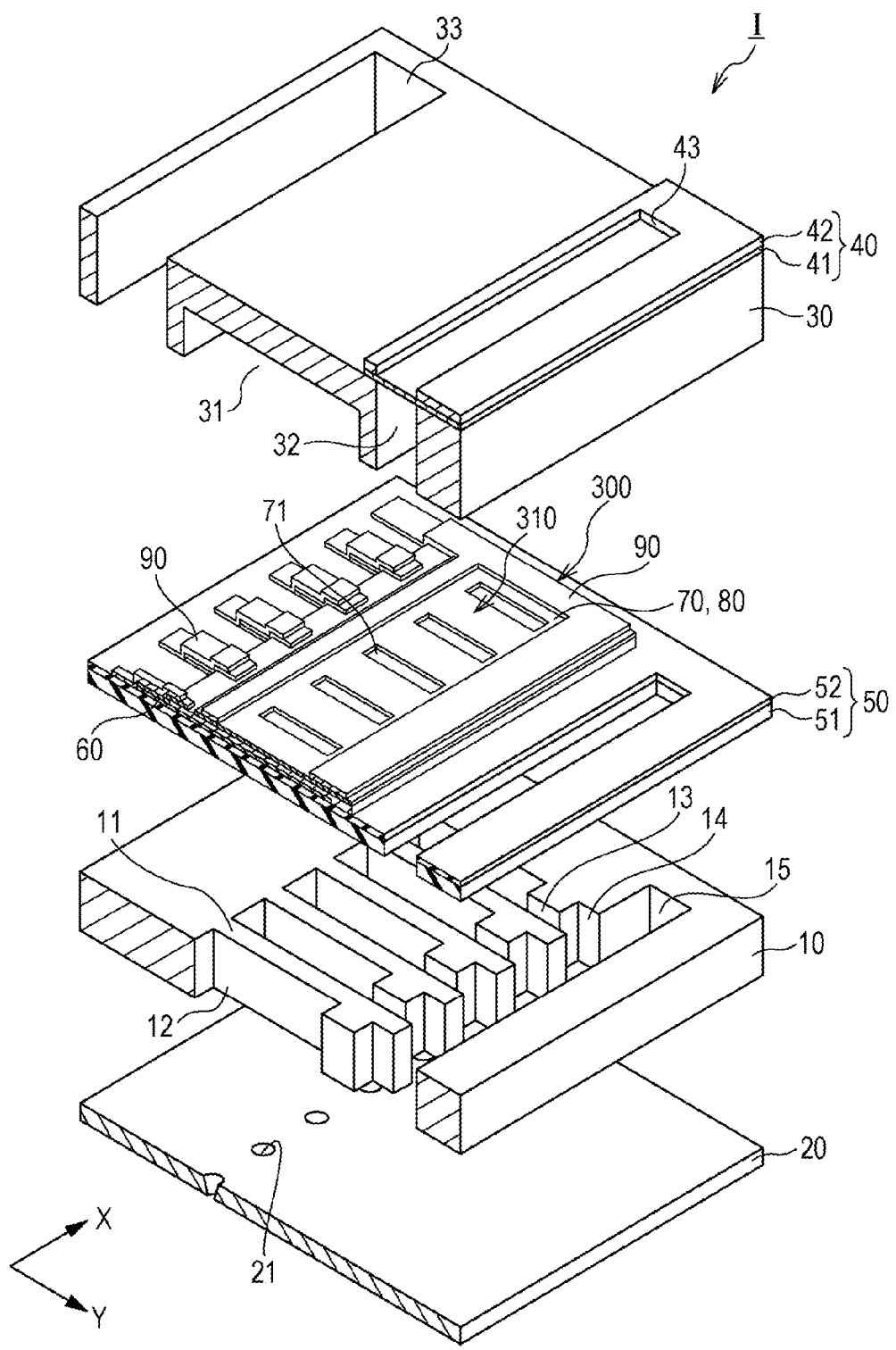
FIG. 1 is an exploded perspective view illustrating a schematic configuration of a recording head according to Embodiment 1.
Figure 2:
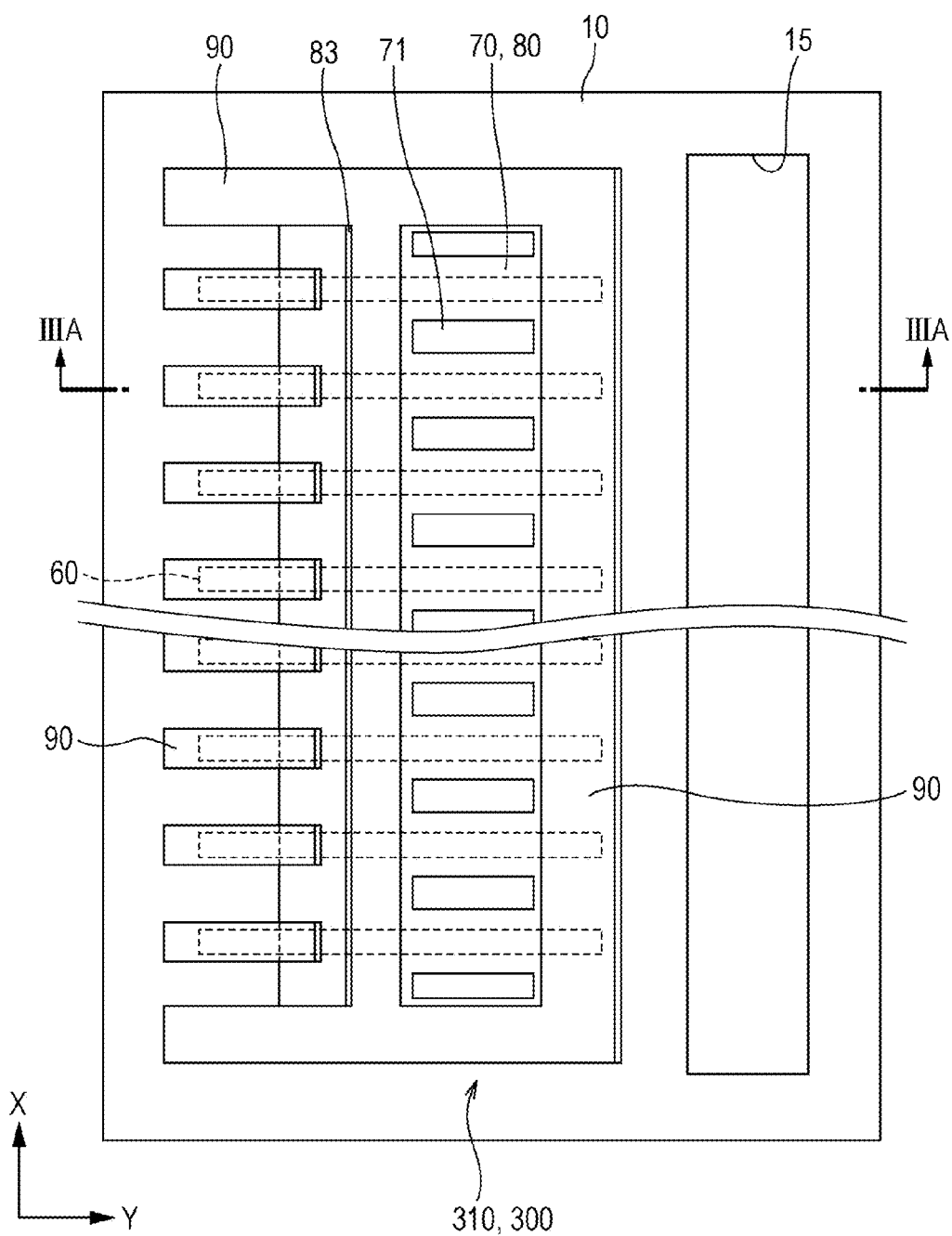
FIG. 2 is a plane view of a recording head according to Embodiment 1.
Figure 3A:
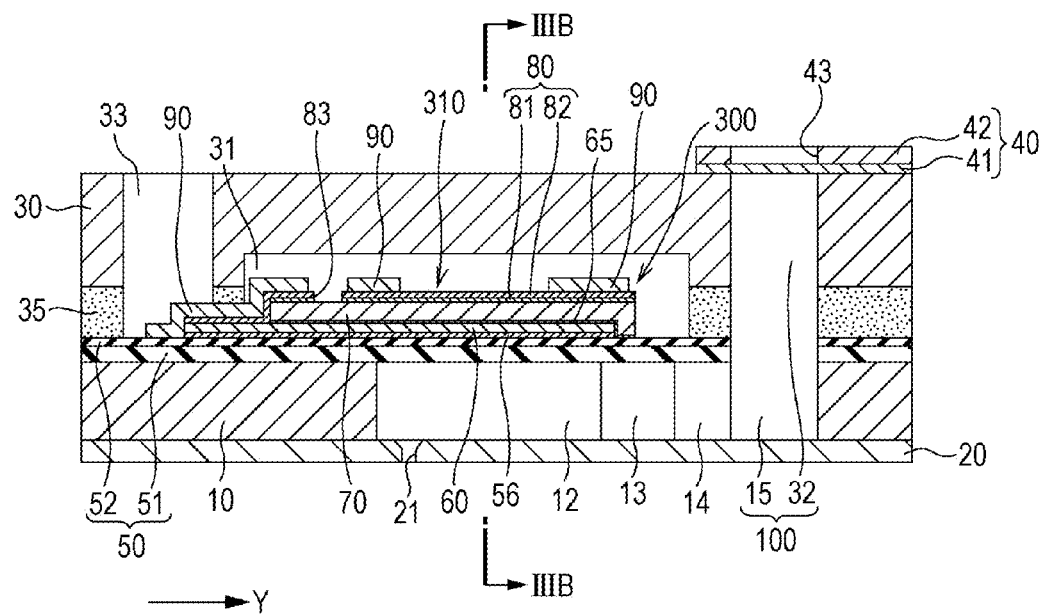
FIGS. 3A and 3B are a cross-section view and an enlarged cross-section view of a main part of a recording head according to Embodiment 1.
Figure 3B:
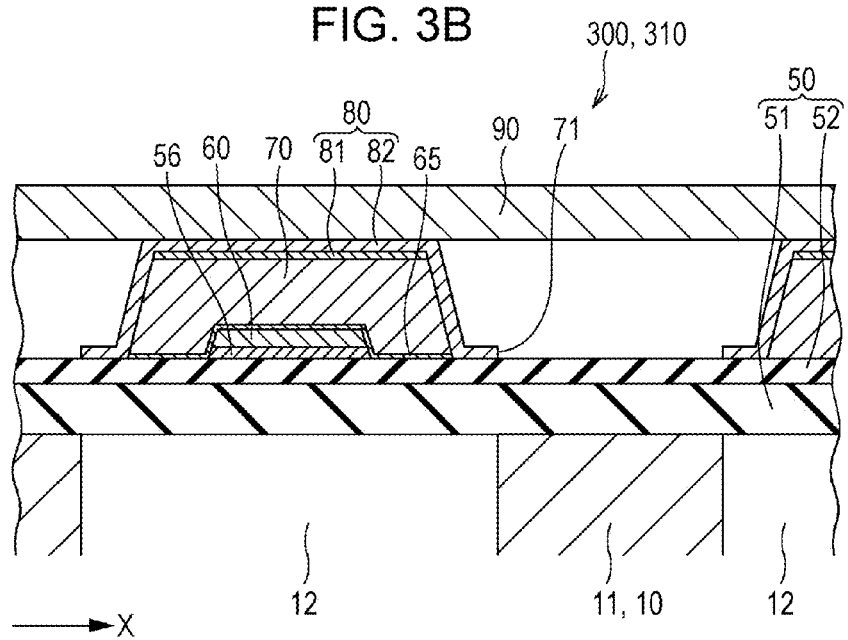

FIG. 1 is an exploded perspective view of an ink jet type recording head which is an example of a liquid ejecting head according to Embodiment 1 of the invention and FIG. 2 is a plane view of FIG. 1. In addition, FIG. 3A is a cross-section view equivalent to an IIIA-IIIA line of FIG. 2 and FIG. 3B is a cross-section view equivalent to an IIIB-IIIB line of FIG. 3A.

As shown in drawings, a pressure generating chamber 12 is formed on a channel forming substrate 10 provided in a recording head I. Moreover, the pressure generating chambers 12 which are partitioned by a plurality of partition walls 11 are provided in parallel along the direction in which a plurality of nozzle openings 21 which discharge the same color ink are provided in parallel. Hereinafter, this direction is referred to as a juxtaposing direction of the pressure generating chambers 12 or a first direction X, and a direction orthogonal to the first direction X is referred to as a second direction Y.

In addition, at an one end part side in a longitudinal direction of the pressure generating chamber 12 of the channel forming substrate 10, that is, at an one end part side in the second direction Y orthogonal to the first direction X, an ink supply passage 13 and a communication passage 14 are partitioned by a plurality of partition walls 11. A communication portion 15 configuring a part of a manifold 100 which becomes a common ink chamber (a liquid chamber) of each pressure generating chamber 12, is formed outside of the communication passage 14 (the side opposite to the pressure generating chamber 12 in the second direction Y). That is, a liquid channel consisting of the pressure generating chamber 12, the ink supply passage 13, the communication passage 14, and the communication portion 15 is provided on the channel forming substrate 10.

A nozzle plate 20 on which the nozzle opening 21 communicating with each pressure generating chamber 12 is bored, is joined to one face side of the channel forming substrate 10, that is, a face on which the liquid channel of the pressure generating chamber 12 or the like opens, by an adhesive, a heat welding film, or the like. That is, the nozzle opening 21 is provided in parallel in the first direction X on the nozzle plate 20. Meanwhile, the nozzle plate 20 consists of, for example, a glass ceramics, a silicon single crystal substrate, a stainless steel, or the like.

A vibration plate 50 is formed on the other face side of the channel forming substrate 10. The vibration plate 50 according to the embodiment is configured with an elastic film 51 consisting of, for example, silicon dioxide or the like and an insulation film 52 consisting of, for example, zirconium oxide ($ZrO_2$) or the like.

In addition, a first electrode 60 provided above the insulation film 52 through an adhesion layer 56 consisting of, for example, titanium or the like, a seed layer 65 which is provided above the first electrode 60 and in which the thickness thereof is, for example, less than 20 nm, a piezoelectric layer 70 which is provided on the seed layer 65 and is a thin film in which the thickness thereof is 3 μm or less and more preferably from 0.3 μm to 1.5 μm, and a second electrode 80 provided above the piezoelectric layer 70 are laminated and formed to configure a piezoelectric element 300. Meanwhile, the term above, mentioned here, includes not only immediately above but also a state where other members are interposed in between. Here, the term the piezoelectric element 300 means a part including the first electrode 60, the seed layer 65, the piezoelectric layer 70 and the second electrode 80. In general, the piezoelectric element 300 is configured by setting any one of electrodes of the piezoelectric element 300 to a common electrode and patterning the other electrode and the piezoelectric layer 70 for each pressure generating chamber 12. In the embodiment, the first electrode 60 is cut and divided for each pressure generating chamber 12 and set to an individual electrode which is independent for each active portion 310 described later, and the second electrode is set to the common electrode of the piezoelectric element 300.

In addition, here, the piezoelectric element 300 and the vibration plate 50 in which the displacement is generated by driving the piezoelectric element 300 are collectively referred to as a piezoelectric actuator. Meanwhile, in the example described above, the elastic film 51, the insulation film 52, the adhesion layer 56, and the first electrode 60 may act as a vibration plate, however, naturally, the vibration plate is not limited thereto, and, for example, only the first electrode 60 may act as a vibration plate without arranging any one or more of the elastic film 51, the insulation film 52, and the adhesion layer 56. In addition, the piezoelectric element 300 itself may substantially serve as a vibration plate 50. However, in a case where the first electrode 60 is directly provided on the channel forming substrate 10, it is preferable that the first electrode 60 is protected by an insulating protection film or the like so as not to electrically connect the first electrode 60 with ink.

Hereinafter, the piezoelectric element 300 configuring the piezoelectric actuator will be described in more detail. The first electrode 60 configuring the individual electrode is formed with a width narrower than the width of the pressure generating chamber 12 in the first direction X of the pressure generating chamber 12. That is, the end part of the first electrode 60 in the first direction X of the pressure generating chamber 12 is positioned inside a region facing to the pressure generating chamber 12. In addition, in the second direction Y, the both end parts of the first electrode 60 respectively extends to the outside of the pressure generating chamber 12.

It is necessary that the material of the first electrode 60 is a material which is not oxidized and can maintain conductivity when the seed layer 65 and the piezoelectric layer 70 are formed. For example, a noble metal such as platinum (Pt) or iridium (Ir) or a conductive oxide typified by lanthanum nickel oxide (LNO) or the like is included. Among those, it is preferable to use platinum from the viewpoint of easiness in orientation of the piezoelectric layer 70. In the embodiment, platinum which is preferentially oriented to the (111) plane and in which the half value width of the diffraction peak derived from the (111) plane by an X-ray diffraction method is 10° or less, is used as the first electrode 60. Here, the term "preferentially orient" means that the whole crystals or most crystals (for example, 80% or more) are oriented in a specific direction, for example, the (111) plane or the (100) plane. In addition, the term "a half value width (FWHM: Full Width at Half Maximum)" means a width of a half value of a peak intensity equivalent to each crystal face indicated by an X-ray diffraction chart (a difference of diffraction angles of two points taking a half value of an extreme value of a peak). It is possible to enhance the crystallinity of the piezoelectric film by using platinum which is preferentially oriented to the (111) plane and in which the half value width is 10° less, as the first electrode 60.

The seed layer 65 consists of a composite oxide which has a perovskite structure and is self-oriented to the (100) plane in which the A site includes bismuth (Bi) and the B site includes iron (Fe) and titanium (Ti). 12 oxygens are coordinated at the A site of a perovskite structure, that is, an $ABO_3$ type structure and, in addition, 6 oxygens are coordinated at the B site to make an octahedron. Bi is positioned at the A site and Fe and Ti are positioned at the B site. Here, the term "self-oriented to a (100) plane" means to be preferentially oriented to a (100) plane by itself without being affected by a base. The seed layer 65 consisting of such a configuration functions as an orientation control layer which makes the piezoelectric layer 70 having a perovskite structure formed on the seed layer 65 preferentially orient to the (100) plane.

In addition, the thickness of the seed layer 65 of the invention is very thin and less than 20 nm. By setting the thickness of the seed layer 65 to less than 20 nm, the voltage distribution to the seed layer 65 is reduced and the voltage is effectively applied to the piezoelectric layer 70. Accordingly, it is possible to enhance the displacement amount. In addition, it is preferable that the seed layer 65 is provided in an island shape. By arranging the seed layer 65 in an island shape, the voltage distribution to the seed layer 65 is much further reduced and it is possible to further enhance the displacement amount.

It is preferable that the molar ratio of Bi at the A site to Fe and Ti of the B site of the composite oxide configuring such the seed layer 65 (Bi/(Fe and Ti)) is from 1.0 to 1.4. Furthermore, it is preferable that the molar ratio of Fe to Ti at the B site (Fe/Ti) is from 9/11 to 3.0. By setting such a composition ratio, the seed layer 65 is self-oriented to the (100) plane and can surely make the piezoelectric layer 70 having a perovskite structure, which is formed thereon, preferentially orient to the (100) plane.

In addition, in a range in which such an orientation function is not inhibited, the composite oxide may be a composite oxide in which a part of elements at the A site or the B site is substituted with other elements and this is also included in the seed layer 65 of the invention. For example, there may exist further elements such as Ba or La at the A site in addition to Bi and there may exist further elements such as Zr or Nb together with Fe and Ti at the B site. On the other hand, as to the seed layer 65, it is preferable to set to a configuration which does not include manganese (Mn) as other elements. By not including Mn in the seed layer 65, the durability is enhanced when the positive voltage is applied to the individual electrode to drive the piezoelectric element and it is possible to suppress insulation breakdown. In addition, as long as the seed layer has the function described above, the seed layer which is deviated from the composition of stoichiometry ($ABO_3$) due to the deficiency or the excess of elements (Bi, Fe, Ti, and O), is also included in the seed layer 65 of the invention.

Meanwhile, the seed layer 65 has a perovskite structure similar to the piezoelectric material which forms the piezoelectric layer 70 described later and has the piezoelectric characteristics while the piezoelectric characteristics are small, and the seed layer 65 together with the piezoelectric layer 70 can be also call the piezoelectric layer.

The piezoelectric layer 70 is a piezoelectric material consisting of a composite oxide having a perovskite structure, that is an $ABO_3$ type structure. As such a piezoelectric material, for example, a composite oxide having a lead-free based perovskite structure which does not include lead is included. As a lead-free based piezoelectric material, for example, bismuth ferrate (($BiFeO_3$), abbreviation "BFO"), barium titanate (($BaTiO_3$), abbreviation "BT"), potassium sodium niobate ((K, Na)$NbO_3$), abbreviation "KNN"), potassium sodium lithium niobate ((K, Na, Li)($NbO_3$)), potassium sodium lithium niobate tantalate ((K, Na, Li)(Nb, Ta)$O_3$), bismuth potassium titanate (($Bi_{1/2}K_{1/2}$)$TiO_3$, abbreviation "BKT"), bismuth sodium titanate (($Bi_{1/2}Na_{1/2}$)$TiO_3$, abbreviation "BNT"), bismuth manganite (($BiMnO_3$), abbreviation "BM"), and the like are included. In addition, a composite oxide including bismuth, potassium, titanium and iron ((Bi, K)(Ti, Fe)$O_3$), a composite oxide including bismuth, iron, barium, and titanium ((Bi, Ba)(Fe, Ti)$O_3$) and a composite oxide in which a metal such as manganese, cobalt or chromium is added thereto ((Bi, Ba)(Fe, Ti, M)$O_3$) (M is Mn, Co, or Cr), and the like are included.

In addition, the piezoelectric material is not limited to a lead-free based piezoelectric material without including lead and a lead based piezoelectric material including lead, for example, lead zirconate titanate (PZT) or a piezoelectric material in which a metal oxide such as niobium oxide, nickel oxide, or magnesium oxide is added thereto can also be used. Specifically, lead titanate ($PbTiO_3$), lead zirconate titanate (Pb(Zr, Ti)$O_3$), lead zirconate ($PbZrO_3$), lead lanthanum titanate ((Pb, La), $TiO_3$), lead lanthanum zirconate titanate ((Pb, La)(Zr, Ti)$O_3$), lead zirconium titanate magnesium niobate ((Pb)(Zr, Ti)(Mg, Nb)$O_3$), and the like are included.

By forming the piezoelectric layer 70 consisting of such a piezoelectric material on the seed layer 65, the piezoelectric layer 70 succeeds a crystal orientation of the seed layer 65 and is preferentially oriented to the (100) plane. Specifically, as shown in Example described later, it is confirmed that the piezoelectric layer 70 is preferentially oriented to the (100) plane with a high orientation rate of at least 89% or more. In the invention, the term orientation rate, mentioned here, is set to a value of $(100)/[(100)+(110)]$ when a peak intensity derived from the (100) plane of a diffraction peak by an X-ray diffraction method (XRD) is compared with a peak intensity derived from the (110) plane. Naturally, as the orientation rate is higher, it is preferable in terms of enhancement of the displacement characteristics and the durability of the piezoelectric layer 70, it is preferable that (100)/[(100)+(110)] is 80% or more and it is more preferable that (100)/[(100)+(110)] is 90% or more. Meanwhile, it is preferable that the piezoelectric layer 70 is a rhombohedral system from the viewpoint that the piezoelectric layer 7 is preferentially oriented to the (100) plane and becomes excellent in displacement characteristics.

Such the piezoelectric layer 70 is continuously provided over the first direction X so that the width of the second direction Y becomes a predetermined width. The width of the second direction Y of piezoelectric layer 70 is larger than the length of the second direction Y of the pressure generating chamber 12. Therefore, in the second direction Y of the pressure generating chamber 12, the piezoelectric layer 70 is provided up to the outside of the pressure generating chamber 12.

In the second direction Y of the pressure generating chamber 12, the end part of the ink supply passage 13 side of the piezoelectric layer 70 is positioned on the outer side than the end part of the first electrode 60. That is, the end part of the first electrode 60 is covered with the piezoelectric layer 70. In addition, the end part of the nozzle opening 21 side of the piezoelectric layer 70 is positioned on the inner side (the pressure generating chamber 12 side) than the end part of the first electrode 60 and the end part of the nozzle opening 21 side of the first electrode 60 is not covered with the piezoelectric layer 70.

In addition, a recessed portion 71 corresponding to each partition wall 11 is formed on the piezoelectric layer 70. The width of the first direction X of the recessed portion 71 is almost the same as the width of the first direction of each partition wall 11 or wider than this. Accordingly, since the rigidity of a part opposed to the end part of the second direction Y of the pressure generating chamber 12 of the vibration plate 50 (that is, an arm portion of the vibration plate 50) is suppressed, it is possible to favorably displace the piezoelectric element 300.

The second electrode 80 is provided on the opposite face side to the first electrode 60 of the piezoelectric layer 70 and is configured as a common electrode which is common to a plurality of active portions 310. In the embodiment, the second electrode 80 is provided with a first layer 81 provided on the piezoelectric layer 70 side and a second layer 82 provided on the side opposite to the piezoelectric layer 70 of the first layer 81. However, the second layer 82 may be omitted.

The first layer 81 consists of an iridium layer or the like in the embodiment and in a case of the piezoelectric layer 70 including an excess component, for example, lead, on the surface of the piezoelectric layer 70 (the second electrode 80 side), the first layer 81 has a function of adsorbing excess lead on the surface of the piezoelectric layer 70 and enhancing the piezoelectric characteristics of the piezoelectric layer 70. Such the first layer 81 is formed only on the piezoelectric layer 70, that is, only on the surface of the side opposite to the channel forming substrate 10 of the piezoelectric layer 70.

In addition, as to the second layer 82 configuring the second electrode 80, a material having conductivity, for example, a metal material such as iridium (Ir), platinum (Pt), palladium (Pd), or gold (Au) can be used. Naturally, a single material of the metal material described above or plural materials in which a plurality of materials are mixed may be used for the second layer 82. In the embodiment, the second layer 82 is continuously provided over the first layer 81, the side face of the piezoelectric layer 70 on which the first layer 81 is not provided, and the first electrode 60.

A lead electrode 90 is connected to the first electrode 60 and the second electrode 80 of the piezoelectric element 300. After such the lead electrode 90 is formed over the entire face of one face of the channel forming substrate 10, the lead electrode 90 can be patterned in a predetermined shape and formed.

A protection substrate 30 for protecting the piezoelectric element 300 is joined onto the channel forming substrate 10 on which the piezoelectric element 300 is formed, by an adhesive 35. A piezoelectric element retaining portion 31 which is a recessed portion which defines a space storing the piezoelectric element 300 is provided on the protection substrate 30. In addition, a manifold portion 32 configuring a part of a manifold 100 is provided on the protection substrate 30. The manifold portion 32 penetrates the protection substrate 30 in a thickness direction (a direction perpendicular to the first direction X and the second direction Y), is formed over a width direction of the pressure generating chamber 12, and is communicated to the communication portion 15 on the channel forming substrate 10, as described above.

A penetration hole 33 which penetrates the protection substrate 30 in a thickness direction is provided on the protection substrate 30. The lead electrode 90 which is connected to the first electrode 60 of each active portion 310 is provided so as to be exposed in the penetration hole 33.

A compliance substrate 40 consisting of a sealing film 41 and a fixing plate 42 is joined to the protection substrate 30 and one face of the manifold portion 32 is sealed by the sealing film 41. In addition, a region facing the manifold 100 of the fixing plate 42 is an opening portion 43 which is completely removed in a thickness direction and one face of the manifold 100 is sealed by only the sealing film 41.

In such an ink jet type recording head in the embodiment, after the ink is taken from an ink outlet connecting to an external ink supply section (not shown) and the inside from the manifold 100 up to the nozzle opening 21 is filled with the ink, and the pressure in each pressure generating chamber 12 is increased and ink droplets are discharged from the nozzle opening 21 by applying the voltage between each first electrode 60 and second electrode corresponding to the pressure generating chamber 12 corresponding to a recording signal from a driving circuit (not shown) and flexurally deforming the vibration plate 50, the adhesion layer 56, the first electrode 60, the seed layer 65, and the piezoelectric layer 70.

Next, an example of a method of manufacturing an ink jet type recording head in the embodiment will described with reference to FIG. 4A to FIG. 7C. Meanwhile, FIG. 4A to FIG. 7C are cross-section views in a longitudinal direction (a second direction) of a pressure generating chamber.

Figure 4A:
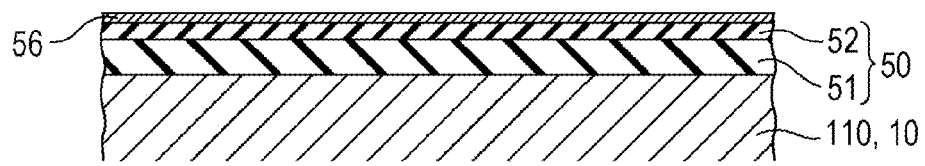
FIGS. 4A, 4B, 4C, and 4D are cross-section views illustrating a manufacturing process of a recording head according Embodiment 1.

Firstly, as shown in FIG. 4A, the elastic film 51 which configures the vibration plate 50 and consists of silicon dioxide ($SiO_2$) or the like is formed on the surface of a wafer for a channel forming substrate which is a silicon wafer and the insulation film 52 consisting of zirconium oxide or the like is formed on the elastic film 51. Next, the adhesion layer 56 consisting of titanium oxide or the like is formed on the entire face of the insulation film 52 by a spattering method, thermal oxidation or the like.

Figure 4B:
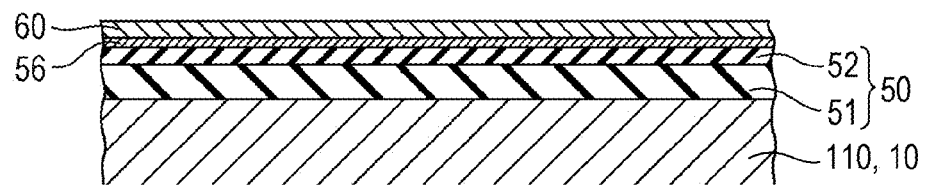
Figure 4C:
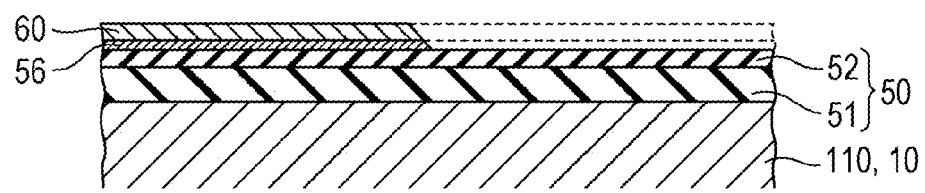

Next, as shown in FIG. 4B, the first electrode 60 consisting of platinum is formed on the entire face of the adhesion layer 56 by a spattering method, a deposition method, or the like. Next, as shown in FIG. 4C, a resist in a predetermined shape (not shown) is set to a mask and the adhesion layer 56 and the first electrode 60 are simultaneously patterned on the first electrode 60.

Figure 4D:
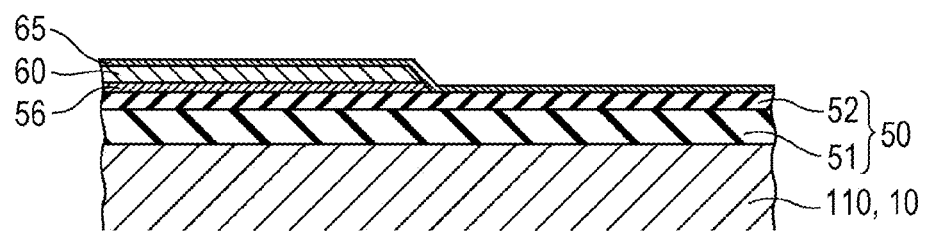

Next, as shown in FIG. 4D, after the resist is peeled off, the seed layer 65 is formed on the first electrode 60 (and the insulation film 52). The seed layer consists of the composite oxide which has a perovskite structure and in which the A site includes Bi and the B site includes Fe and Ti. Such the seed layer 65 can be formed using a chemical solution method such as, for example, a Metal-Organic Decomposition (MOD) method in which the seed layer 65 consisting of a metal oxide is obtained by applying a precursor solution including a metal complex to form a seed layer precursor film, drying the film, and further calcining the film at a high temperature or a sol-gel method, that is, a liquid phase method. Alternatively, the seed layer 65 can be also formed by a laser ablation method, a spattering method, a pulse laser deposition method (a PLD method), a CVD method, an aerosol deposition method, or the like.

As a specific example of the formation procedure in a case of forming the seed layer 65 by a chemical solution method (liquid phase method), firstly, the seed layer precursor film (not shown) is formed by applying a composition for forming a seed layer (the precursor solution of the seed layer) consisting of an MOD solution or a sol including a metal complex containing Bi, Fe, and Ti using a spin coating method or the like (a seed layer precursor solution applying process).

The precursor solution of the seed layer which is applied is a solution in which the metal complex which can form the composite oxide in which the A site includes Bi and the B site includes Fe and Ti by calcining, is mixed and the mixture is dissolved or dispersed in an organic solvent. As a metal complex respectively including Bi, Fe, and Ti, for example, an alkoxide, an organic acid salt, a $\beta$-diketone complex or the like can be used. As a metal complex including Bi, for example, bismuth 2-ethylhexanoate, bismuth acetate, and the like are included. As a metal complex including Fe, for example, iron 2-ethylhexanoate, iron acetate, tris(acetylacetonato) iron and the like are included. As a metal complex including Ti, for example, titanium 2-ethylhexanoate, titanium acetate, and the like are included. In addition, as a solvent of the precursor solution of the seed layer, propanol, butanol, pentanol, hexanol, octanol, ethylene glycol, propylene glycol, octane, decane, cyclohexane, xylene, toluene, tetrahydrofuran, acetic acid, octyl acid, and the like are included.

Next, this seed layer precursor film is heated to a predetermined temperature (for example, from 150° C. to 200° C.) and then dried for a certain time (a seed layer drying process). Next, the dried seed layer precursor film is degreased by heating to a predetermined temperature (for example, from 350° C. to 450° C.) and retaining for a certain time (a seed layer degreasing process). The term degrease, mentioned here, means that an organic component included in the seed layer precursor film is separated as, for example, $NO_2$, $CO_2$, $H_2O$, or the like. An atmosphere in the seed layer drying process or the seed layer degreasing process is not limited and may be in the air, in an oxygen atmosphere, or in an inert gas.

Next, the seed layer precursor film is crystallized by heating to a predetermined temperature, for example, from approximately 600° C. to 850° C., and retaining for a certain time, for example, for 1 minute to 10 minutes and the seed layer 65 consisting of the composite oxide which has a perovskite structure and in which the A site includes Bi and the B site includes Fe and Ti is formed (a seed layer calcining process).

In this seed layer calcining process, an atmosphere is not also limited and may be in the air, in an oxygen atmosphere, or in an inert gas. As a heating apparatus using in the seed layer drying process, the seed layer degreasing process, and the seed layer calcining process, for example, an RTA (Rapid Thermal Annealing) apparatus for heating by irradiation by an infrared light lamp, a hot plate, and the like are included.

The seed layer 65 thus formed consists of the composite oxide which has a perovskite structure and is preferentially oriented to the (100) plane in which the A site includes Bi and the B site includes Fe and Ti. Accordingly, the piezoelectric layer 70 which is formed on the seed layer 65 inherits an orientation of the seed layer 65 and is preferentially oriented to the (100) plane. In addition, since the seed layer 65 of the invention is very thin with a thickness of 20 µm or less, the voltage distribution to the seed layer 65 is reduced and the voltage is effectively applied to the piezoelectric layer 70. Accordingly, it is possible to enhance the displacement amount. Meanwhile, in the embodiment, while the applying process performed once and the seed layer 65 consisting of one layer was formed, the seed layer 65 consisting of a plurality of layers may be formed.

Figure 5A:
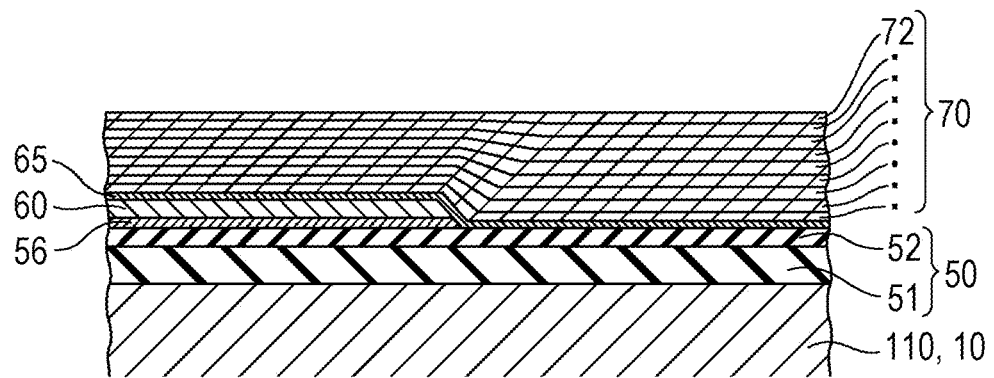
FIGS. 5A and 5B are cross-section views illustrating a manufacturing process of a recording head according Embodiment 1.

Next, as shown in FIG. 5A, a plurality of layers of the piezoelectric film 72 are formed on the seed layer 65 to form the piezoelectric layer 70. In the embodiment, a case where 10 layers of the piezoelectric film 72 consisting of the composite oxide having a perovskite structure including Bi, Ba, Fe, and Ti are formed will be described. The piezoelectric film 72 can be formed, for example, by a chemical solution method such as an MOD method in which the piezoelectric film 72 is obtained by applying a solution including the metal complex, drying the film, and calcining the film or a sol-gel method, that is, a liquid phase method, in the same way as the seed layer 65. Alternatively, the piezoelectric film 72 can be also formed by a laser ablation method, a spattering method, a pulse laser deposition method (a PLD method), a CVD method, an aerosol deposition method, or the like.

As a specific example of the formation procedure in a case of forming the piezoelectric film 72 by a chemical solution method (liquid phase method), firstly, the piezoelectric precursor film (not shown) is formed by applying a composition for forming an oxide layer (the precursor solution) consisting of an MOD solution or a sol including the metal complex, specifically, the metal complex containing Bi, Ba, Fe, and Ti onto the seed layer 65 using a spin coating method or the like (an applying process).

The precursor solution which is applied is a solution in which the metal complex which can form the piezoelectric precursor film including Bi, Ba, Fe, and Ti is mixed by calcining and the mixture is dissolved or dispersed in an organic solvent. In addition, in a case where the piezoelectric precursor film including Mn, Co, or Cr is formed, the precursor solution containing the metal complex further having Mn, Co, or Cr, is used. As to the mixing proportion of the metal complex having the metal complex respectively including Bi, Ba, Fe, Ti, Mn, Co, and Cr, each metal may be mixed so as to become the desired molar ratio. As a metal complex respectively including Bi, Ba, Fe, Ti, Mn, Co, and Cr, for example, an alkoxide, an organic acid salt, a $\beta$-diketone complex or the like can be used. As to the metal complex including Bi, Fe, and Ti, the same metal complex as the metal complex used when the seed layer precursor film is formed can be used. As a metal complex including Ba, for example, barium acetate, barium isopropoxide, barium 2-ethylhexanoate, barium acetylacetonate, and the like are included. As a metal complex including Mn, for example, manganese 2-ethylhexanoate, manganese acetate, and the like are included. As an organic metal compound including Co, for example, cobalt 2-ethylhexanoate, cobalt (III) acetylacetonate, and the like are included. As an organic metal compound including Cr, for example, chromium 2-ethylhexanoate and the like are included. Naturally, the metal complex including two kinds or more of Bi, Ba, Fe, Ti, Mn, Co, and Cr may be used. In addition, as a solvent of the precursor solution, propanol, butanol, pentanol, hexanol, octanol, ethylene glycol, propylene glycol, octane, decane, cyclohexane, xylene, toluene, tetrahydrofuran, acetic acid, octyl acid, and the like are included.

Next, this piezoelectric precursor film is heated to a predetermined temperature, for example, from approximately 130° C. to 180° C. and then dried for a certain time (a drying process). Next, the dried piezoelectric precursor film is degreased by heating to a predetermined temperature, for example, from 300° C. to 400° C. and retaining for a certain time (a degreasing process). Meanwhile, the term degrease, mentioned here, means that an organic component included in the piezoelectric precursor film is separated as, for example, $NO_2$, $CO_2$, $H_2O$, or the like.

Next, the piezoelectric precursor film is crystallized by heating to a predetermined temperature, for example, from approximately 650° C. to 800° C. and retaining for a certain time and piezoelectric film 72 is formed (a calcining process). As a heating apparatus used in the drying process, the degreasing process, and the calcining process, for example, an RTA (Rapid Thermal Annealing) apparatus for heating by irradiation by an infrared light lamp, a hot plate, and the like are included.

Figure 5B:
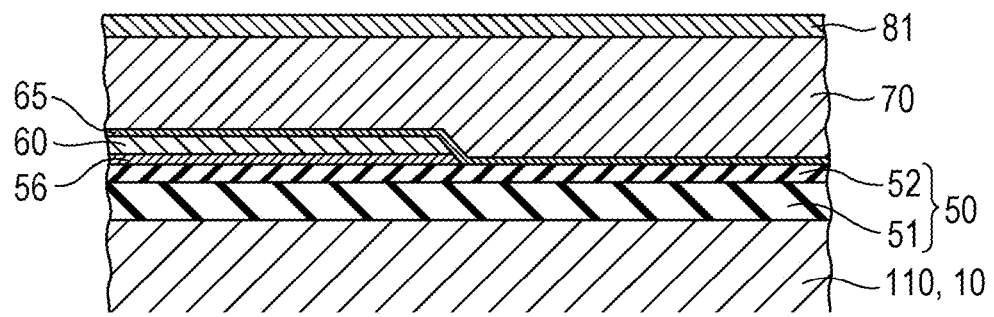

Next, the applying process, the drying process, and the degreasing process or the applying process, the drying process, the degreasing process, and the calcining process described above are repeated a plurality of times depending on a desired film thickness or the like and the piezoelectric layer 70 consisting of 10 layers of the piezoelectric film 72 is formed. For example, in a case where the film thickness of an application solution per time is approximately 0.1 µm, for example, the entire film thickness of the piezoelectric layer 70 consisting of 10 layers of the piezoelectric film 72 becomes approximately 1.0 µm. Meanwhile, the piezoelectric film 72 (the piezoelectric layer 70) may be only one layer. After the piezoelectric layer 70 is formed, the first layer 81 is formed on the entire face of the piezoelectric layer 70, as shown in FIG. 5B.

Figure 6A:
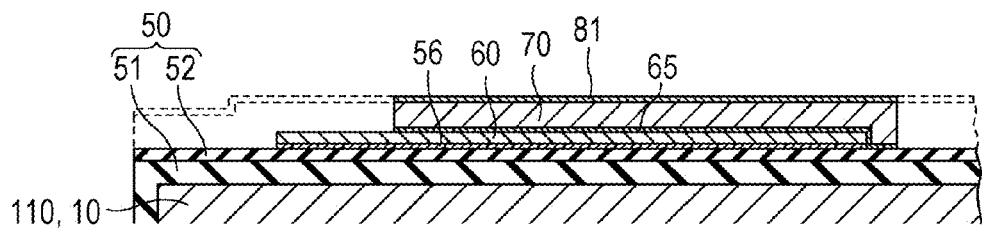
FIGS. 6A, 6B, and 6C are cross-section views illustrating a manufacturing process of a recording head according Embodiment 1.

Next, as shown in FIG. 6A, the first layer 81 and the piezoelectric layer 70 are patterned corresponding to each pressure generating chamber 12. The first layer 81 is formed, for example, by laminating an iridium layer having iridium and a titanium layer having titanium on the iridium layer. Meanwhile, the iridium layer and the titanium layer can be formed by a spattering method, a CVD method, or the like. In addition, for the patterning of the first layer 81 and the piezoelectric layer 70, for example, a so-called photolithography method of arranging a mask (not shown) formed in a predetermined shape on the first layer 81 and etching the first layer 81 and the piezoelectric layer 70 through the mask was used. Meanwhile, the patterning of the first layer 81 and the piezoelectric layer 70 can be also performed, for example, by dry etching such as reactive ion etching or ion milling, wet etching, or the like.

Figure 6B:
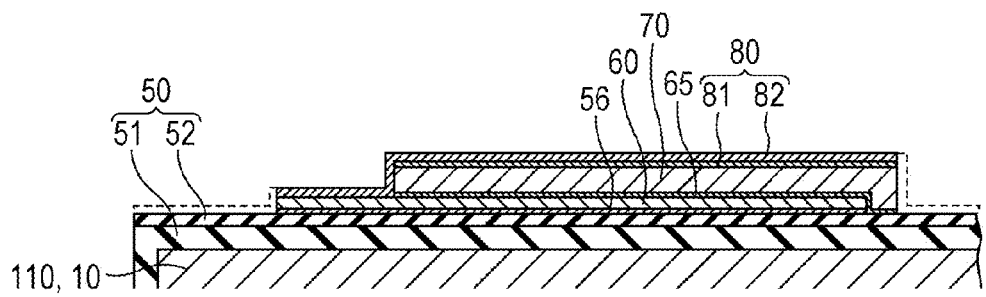

Next, as shown in FIG. 6B, the second electrode 80 is formed by forming and patterning the second layer 82 consisting of, for example, iridium (Ir) over one face side of a wafer for a channel forming substrate 110 (the face side on which the piezoelectric layer 70 is formed), that is, over the first layer 81, on the side face on which the piezoelectric layer 70 is patterned, on the insulation film 52, on the first electrode 60, or the like.

Figure 6C:
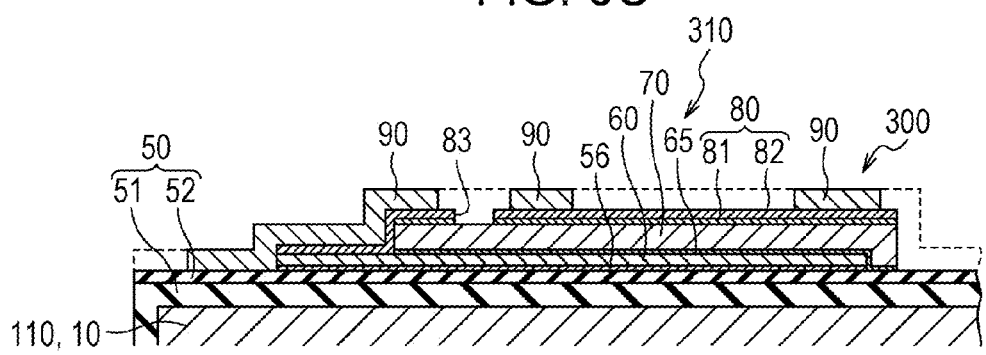

Next, as shown in FIG. 6C, after the lead electrode consisting of, for example, gold (Au) or the like is formed over the entire face of the wafer for a channel forming substrate 110, the patterning is performed for each piezoelectric element 300 through a mask pattern (not shown) consisting of, for example, a resist or the like. Meanwhile, in the patterning of the piezoelectric element 300, a part of the second electrode 80 is simultaneously patterned and a removal portion 83 is formed. Accordingly, the active portion 310 of the piezoelectric element 300 is defined.

Next, as shown in FIG. 7A, after a wafer for a protection substrate 130 which is a silicon wafer and becomes a plurality of protection substrates 30 is joined to the piezoelectric element 300 side of the wafer for a channel forming substrate 110 through the adhesive 35, the wafer for a channel forming substrate 110 is thinned down to a predetermined thickness.

Next, as shown in FIG. 7B, a mask film 54 is newly formed on the wafer for a channel forming substrate 110 and patterned into a predetermined shape.

Moreover, as shown in FIG. 7C, the pressure generating chamber 12, the ink supply passage 13, the communication passage 14, the communication portion 15, and the like corresponding to the piezoelectric element 300 are formed by subjecting the wafer for a channel forming substrate 110 to piezoelectric element anisotropic etching (wet etching) using an alkaline solution such as KOH or the like through the mask film 54.

Afterward, an unnecessary part of an outer peripheral edge part of the wafer for a channel forming substrate 110 and the wafer for a protection substrate 130 is removed by cutting by, for example, dicing or the like. Moreover, after the mask film 54 on the face of the side opposite to the wafer for a protection substrate 130 of the wafer for a channel forming substrate 110, is removed, the ink jet type recording head I of the embodiment is set by joining the nozzle plate 20 in which the nozzle opening 21 is bored, also joining the compliance substrate 40 to the wafer for a protection substrate 130, and dividing the wafer for a channel forming substrate 110 or the like into one chip size of the channel forming substrate 10 or the like as shown in FIG. 1.

According to the invention, the piezoelectric layer 70 on the seed layer can be preferentially oriented to the (100) plane by arranging the seed layer 65 which has a perovskite structure and is preferentially oriented to the (100) plane in which the A site includes Bi and the B site includes Fe and Ti. In addition, since the seed layer 65 is as thin as less than 20 nm, the voltage distribution to the seed layer 65 is reduced, and thus the piezoelectric element 300 in which the displacement amount is enhanced and the ink jet type recording head I provided with the piezoelectric element 300 can be realized.

Hereinafter, more specifically, the invention will be described by showing Example. Meanwhile, the invention is not limited to Example.

EXAMPLE

Sample 1

Preparation of Substrate

Firstly, a silicon dioxide film having a thickness of 1,170 nm was formed on a single crystal silicon substrate as the elastic film 51 by thermal oxidation. Next, a zirconium oxide film having a thickness of 400 nm was formed as the insulation film 52 by forming a zirconium film having a thickness of 285 nm on the silicon dioxide film by a sputtering method and subjecting the zirconium film to thermal oxidation. Afterward, a titanium oxide film was formed as the adhesion layer 56 by forming a titanium film having a thickness of 20 nm on the zirconium oxide film by a sputtering method and subjecting the titanium film to thermal oxidation. Next, the first electrode 60 which consisted of a platinum film (Pt) having a thickness of 130 nm and was preferentially oriented to the (111) plane was formed on the titanium oxide film by a sputtering method at 600° C. to set a substrate with an electrode.

Preparation of Precursor Solution of Seed Layer

An n-octane solution of bismuth 2-ethylhexanoate, iron 2-ethylhexanoate, and titanium 2-ethylhexanoate (all were 0.5 mol/L) were mixed such that the molar ratio of Bi:Fe:Ti was 120:60:40 as a molar ratio of each element, a raw material solution including Bi, Fe, and Ti (hereinafter, referred to as a "BFT raw material solution") was prepared, and the BFT raw material solution was diluted with n-octane to set the precursor solution of the seed layer (hereinafter, referred to as a "BFT precursor solution"). Meanwhile, by using the BFT precursor solution, the dilution proportion of n-octane to the BFT raw material solution was set to 1:7 as in BFT raw material solution:n-octane. By using the BFT precursor solution, the seed layer 65 having a composition in which the molar ratio of Bi to Fe and Ti (Bi/(Fe+Ti)) becomes 1.2 and the molar ratio of Fe to Ti (Fe/Ti) becomes 1.5 is formed by the procedure described later.

Preparation of Precursor Solution of Piezoelectric Layer

In order to form the piezoelectric film 72 consisting of the composite oxide having a perovskite structure including Bi, Ba, Fe, Ti, and Mn, each n-octane solution of bismuth 2-ethylhexanoate, barium 2-ethylhexanoate, iron 2-ethylhexanoate, titanium 2-ethylhexanoate, and manganese 2-ethylhexanoate was mixed such that the molar ratio of Bi:Ba:Fe:Ti:Mn is Bi:Ba:Fe:Ti:Mn=75:25:71.25:25:3.75 and the precursor solution of the piezoelectric layer including Bi, Ba, Fe, Ti, and Mn (hereinafter, a "BFM-BT precursor solution") was prepared (BFM:BT=75:25).

Formation of Seed Layer

The seed layer precursor film was formed by dropping the BFT precursor solution onto the substrate with an electrode and spin coating the substrate with an electrode by rotating at 3,000 rpm (a seed layer precursor solution applying process). Next, the seed layer precursor film was heated for 4 minutes at 350° C. after being heated for 4 minutes on a hot plate at 180° C. (a seed layer drying process and a seed layer degreasing process). Next, the seed layer precursor film was calcining for 5 minutes at 700° C. using an RTA apparatus (a seed layer calcining process). By the processes described above, the seed layer which consisted of the composite oxide having a perovskite structure including Bi, Fe, and Ti (hereinafter, also referred to as "BFT") and was a film shape, and in which the thickness was 15 nm, was formed.

Formation of Piezoelectric Film

Next, the piezoelectric layer precursor film was formed by dropping the BFM-BT precursor solution onto the substrate with an electrode and spin coating the substrate with an electrode by rotating at 3,000 rpm (an applying process). Next, the piezoelectric layer precursor film was heated for 4 minutes at 350° C. after being heated for 4 minutes on a hot plate at 180° C. (a drying process and a degreasing process). After the process consisting of the applying process, the drying process, and the calcining process were repeated twice, calcining was performed in an oxygen atmosphere for 5 minutes at 750° C. using an RTA apparatus (a calcining process). Next, the piezoelectric layer 70 consisting of 12 layers of the piezoelectric films 72 which was the composite oxide having a perovskite structure including Bi, Ba, Fe, Ti, and Mn (hereinafter, also referred to as "BFM-BT") and in which the total thickness was 900 nm, was formed by repeating the process in which the combination of processes described above consisting of the applying process, the drying process, and the calcining process is combined in the same way 6 times to apply total 12 times.

Production of Second Electrode and Piezoelectric Element

Next, an iridium film having a thickness of 50 nm was formed on the piezoelectric layer 70 by a spattering method, the second electrode 80 was produced by patterning into a desired size by photolithography. Accordingly, the piezoelectric element 300 provided with the first electrode 60, the seed layer 65, the piezoelectric layer 70, and the second electrode 80, was produced.

Sample 2

The piezoelectric element was produced by the same technique as that of Sample 1 except setting the thickness of the platinum film configuring the first electrode to 50 nm.

Sample 3

The piezoelectric element was produced by the same technique as that of Sample 2 except setting the thickness of the platinum film configuring the first electrode to 50 nm and setting the seed layer to the island shape and the thickness of 10 nm.

Sample 4

The piezoelectric element was produced by the same technique as that of Sample 2 except setting the seed layer to an island shape having a thickness of 8 nm.

Sample 5

The piezoelectric element was produced by the same technique as that of Sample 3 except forming the platinum film configuring the first electrode with a thickness of 130 nm at 330° C.

Sample 6

The piezoelectric element was produced by the same technique as that of Sample 3 except forming the piezoelectric layer having a thickness of 630 nm using the following PZT precursor solution.

As to the PZT precursor solution, firstly, a mixture in which lead acetate 3 hydrate ($Pb(CH_3COO)_2 \cdot 3H_2O$) and titanium isopropoxide ($Ti[OCH(CH_3)_2]_4$), zirconium acetyl acetonate ($Zr(CH_3COCHCOCH_3)_4$) as a main raw material, buthylcellosolve ($C_6H_{14}O_6$) as a solvent, diethanolamine ($C_4H_{11}NO_2$) as a stabilizer, and polyethylene glycol ($C_2H_6O_6$) as a thickener were mixed, was used. Meanwhile, the molar ratio of each component in the PZT precursor solution was set to lead acetate 3 hydrate:titaniumisopropoxide:zirconium acetyl acetonate:buthylcellosolve:diethanolamine:polyethylene glycol=1.1:0.44:0.56:3:0.65:0.5. In addition, 10% of excess amount of lead acetate 3 hydrate is added in consideration of a decrease thereof due to evaporation.

Sample 7

The piezoelectric element was produced by the same technique as that of Sample 1 except forming the platinum film configuring the first electrode at room temperature.

Sample 8

The piezoelectric element was produced in the same way as that of Sample 1 except forming piezoelectric layer without providing with the seed layer.

Sample 9

The piezoelectric element was produced in the same way as that of Sample 1 except setting the seed layer to a film shape having a thickness of 30 nm.

Test Example 1

Figure 8:
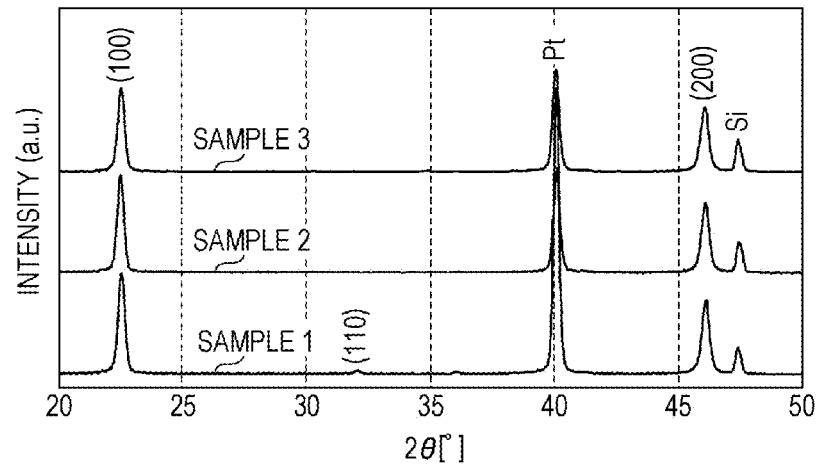
FIG. 8 is a view illustrating X-ray diffraction patterns of Samples.
Figure 9:
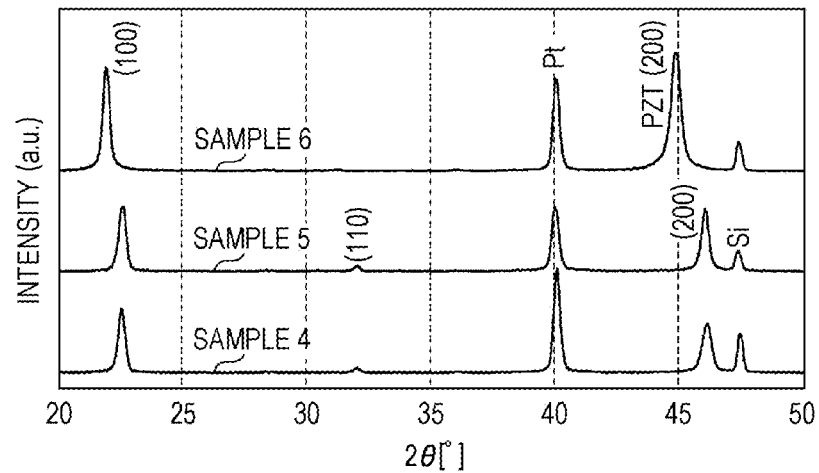
FIG. 9 is a view illustrating X-ray diffraction patterns of Samples.
Figure 10:
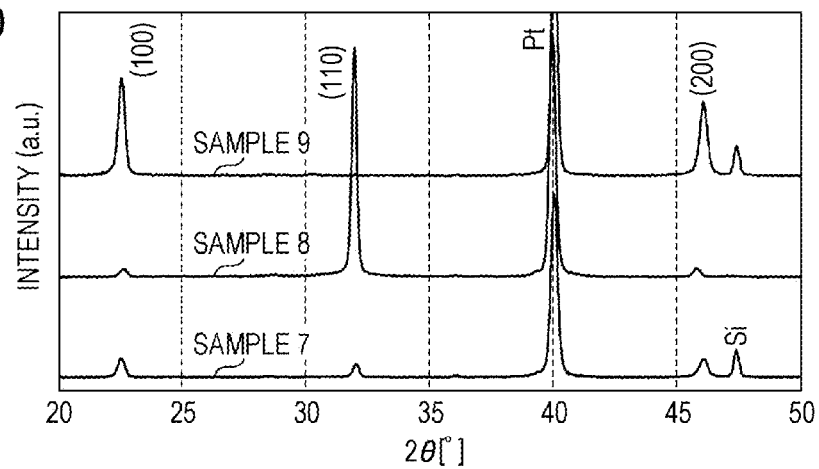
FIG. 10 is a view illustrating X-ray diffraction patterns of Samples.

"D8 Discover With GADDS; a minute region X-ray diffraction apparatus" manufactured by Bruker AXS, Inc. was used, a CuKα ray was used as an X-ray source, and the X-ray diffraction charts of Samples 1 to 8 were determined at room temperature before the second electrode was formed. The X-ray diffraction patterns of the piezoelectric layers of Samples 1 to 3 are shown in FIG. 8 and the X-ray diffraction patterns of the piezoelectric layers of Samples 4 to 6 are shown in FIG. 9. The X-ray diffraction patterns of the piezoelectric layers of Samples 7, 8, and 9 are shown in FIG. 10.

Here, the peak in the vicinity of 2θ=22.5° is a peak derived from the (100) plane and the peak in the vicinity of 2θ=31.8° is a peak derived from the (110) plane.

The value of (100)/[(100)+(110)] was determined from the ratio of the peak intensities to set an orientation rate of the (100) plane. The results are shown in Table.

TABLE

| | First electrode Platinum film (Pt) | | | | | |
|---|---|---|---|---|---|---|
| | Formation temperature Thickness | Half value width of diffraction peak of (111) plane | Seed layer (BFT) Thickness | Piezoelectric layer (BFM-BT) | Orientation rate (100)/ [(100) + (111)] | Displacement proportion |
| Sample 1 | 600° C. 130 nm | 2.7° | Film shape 15 nm | BFM-BT | 96.0% | 1.03 |
| Sample 2 | 600° C. 50 nm | 3.8° | Film shape 15 nm | BFM-BT | 97.2% | 1.03 |
| Sample 3 | 600° C. 50 nm | 3.8° | Island shape 10 nm | BFM-BT | 98.6% | 1.10 |
| Sample 4 | 600° C. 50 nm | 3.8° | Island shape 8 nm | BFM-BT | 92.6% | 1.13 |
| Sample 5 | 330° C. 130 nm | 7.3° | Island shape 10 nm | BFM-BT | 89.7% | 1.01 |
| Sample 6 | 600° C. 50 nm | 3.8° | Island shape 10 nm | PZT | 98.3% | — |
| Sample 7 | Room temperature 130 nm | 13.8° | Film shape 15 nm | BFM-BT | 58.0% | 0.93 |
| Sample 8 | 600° C. 130 nm | 2.7° | None | BFM-BT | 8.9% | 0.88 |
| Sample 9 | 600° C. 130 nm | 2.7° | Film shape 30 nm | BFM-BT | 96.3% | 1.00 |

As shown in FIG. 8 and FIG. 9, in Samples 1 to 6, the peaks oriented to the (110) plane were hardly recognized and all peaks oriented to the (100) plane became sharp. When the orientation ratio of the (100) plane was determined from these peak intensities, all orientation ratios became high orientation ratios as 89% or more. Furthermore, in Samples 1 to 6, the sharp peaks oriented to a (200) plane which was a plane equivalent to the (100) plane were also recognized. As a result, it was found that even the piezoelectric layer was BFM-BT or PZT, it was possible to preferentially orient the piezoelectric layer to the (100) plane with a high orientation ratio by using the first electrode consisting of Pt in which the half value width of the diffraction peak of the (111) plane was 10° or less and the seed layer consisting of BFT in which the thickness was extremely thin (15 nm or less).

On the other hand, as shown in FIG. 10, it was found that even the seed layer consisting of BFT in which the thickness is 15 nm was used, the peak oriented to the (100) plane became remarkably small and the piezoelectric layer was not preferentially oriented to the (100) plane in Sample 7 provided with the first electrode in which the half value width of the diffraction peak of the (111) plane was bigger than 10°. In addition, in Sample 8 not provided with the seed layer, the extremely small peak oriented to the (100) plane and the sharp peak oriented to the (110) plane were recognized and it was found to be preferentially oriented to the (110) plane. When the orientation ratios of the (100) plane were determined from these peak intensities, Sample 7 was 58% and Sample 8 was 8.9%, and both became low orientation ratios. In Sample 9, the peak oriented to the (110) plane was hardly recognized and the peak oriented to the (100) plane became sharp.

In addition, from the results of Samples 1 to 6, it was found that even the thickness of the first electrode was 130 nm and 50 nm or even the shape of the seed layer was an island shape or a film shape, it was possible to preferentially orient the piezoelectric layer to the (100) plane with a high orientation ratio. Meanwhile, since the voltage distribution to the seed layer is further reduced when the shape of the seed layer is an island shape, the displacement amount is enhanced as shown in Test Example 2 described above.

Test Example 2

The displacement amount of the piezoelectric element (CAV) in a case where the liquid ejecting heads provided with the piezoelectric elements of Samples 1 to 5 and 7 to 9 were produced and the voltage by a pulse waveform at 45 V was applied, was determined. The displacement amount is represented as a displacement proportion in a case where the displacement of Sample 9 is set to 1 and is shown in Table.

As a result, it was found that in the piezoelectric elements of Samples 1 to 5, the displacement amount was enhanced, compared with Sample 9.

Test Example 3

Figure 11:
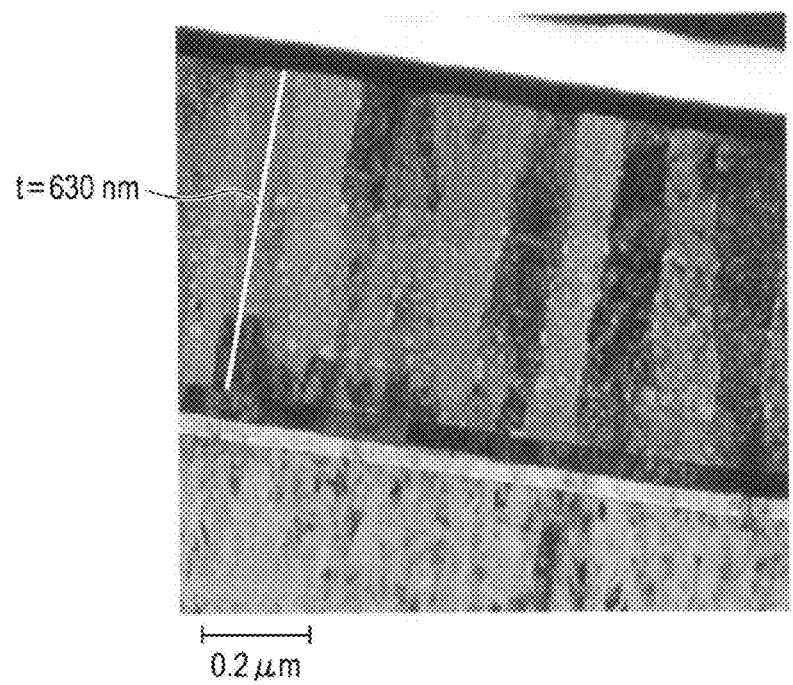
FIG. 11 is an EFTEM-BF image of a piezoelectric element of Sample.

As to the piezoelectric element of Sample 6, the cross-section in a thickness direction was observed using an energy-filtering transmission electron microscope (EFTEM). The obtained EFTEM-Bright Field (BF) image is shown in FIG. 11. In addition, an enlarged photograph of the vicinity of the first electrode 60 in FIG. 11 is shown in FIG. 12.

Figure 12:
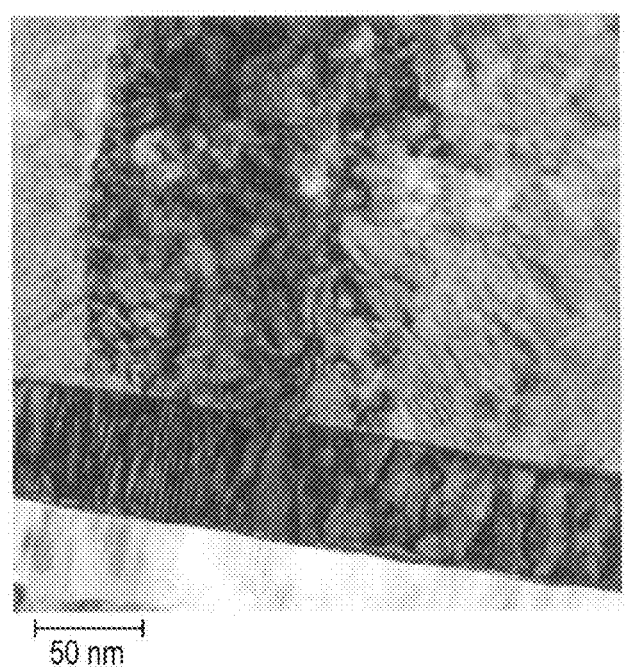
FIG. 12 is an enlarged view of an EFTEM-BF image of a piezoelectric element of Sample.

As a result, as shown in FIG. 11 and FIG. 12, the piezoelectric layer 70 was matched and grown on the seed layer (oxide) 65 on the first electrode 60, the interface lattice matching properties were excellent, and an interface contrast due to a defect or the like was hardly recognized.

Figure 13:
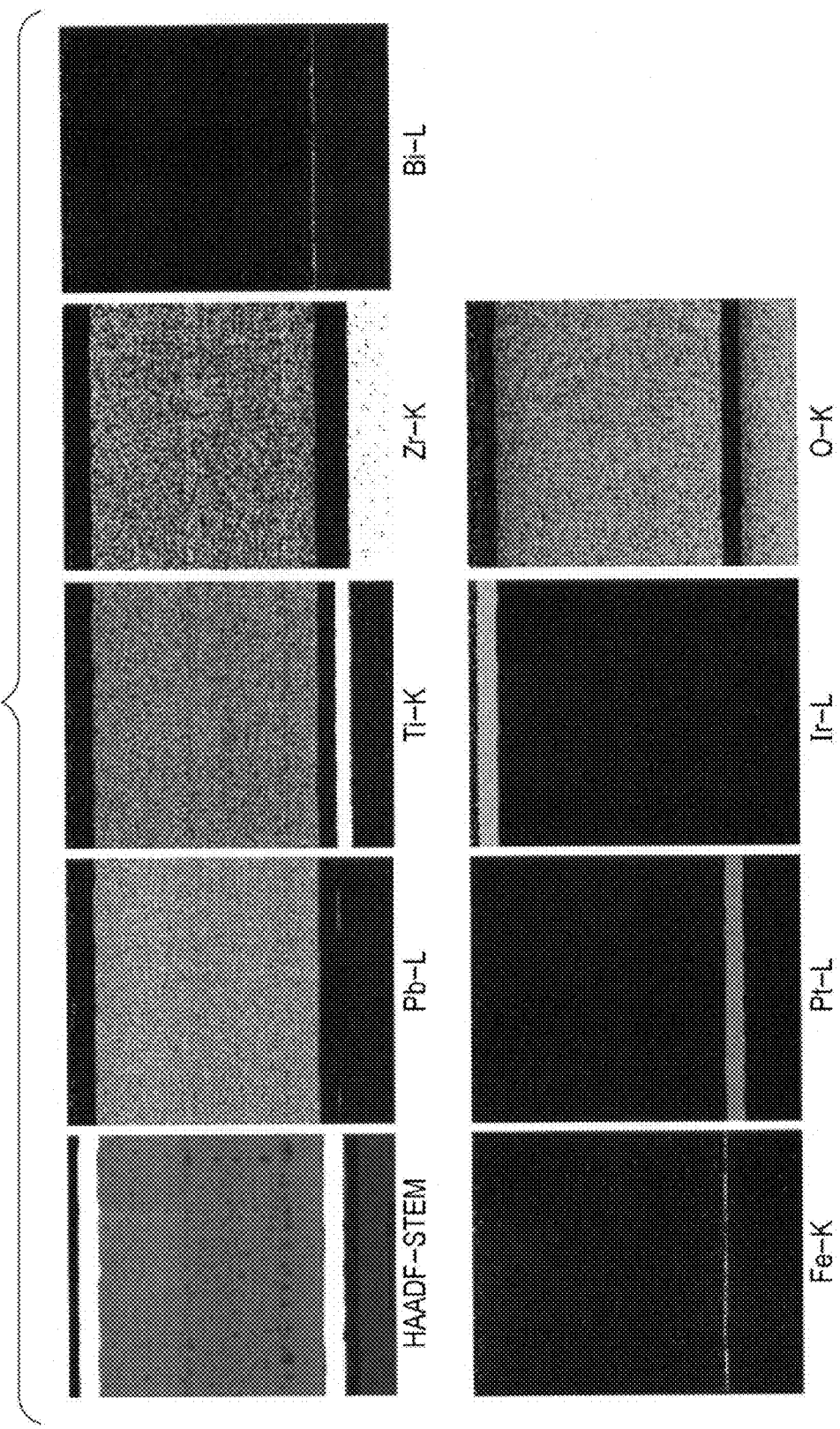
FIG. 13 is an STEM-EDS map image of a piezoelectric element of Sample.

As to the piezoelectric element of Sample 6, the cross-section in a thickness direction was measured by an STEM-HAADF (High Angle Annular Dark Field) and each element of Pb, Ti, Zr, Bi, Fe, Pt, Ir, and O was measured by a Scanning Transmission Electron Microscope-Energy Dispersive Spectroscopy (STEM-EDS). The results are shown in FIG. 13. As shown in FIG. 13, the seed layer (oxide) 65 contained Bi, Fe, Ti, Pb, Pt, and O and the film thickness thereof was approximately 10 nm. In addition, the piezoelectric layer 70 contained Pb, Zr, Ti, and O. Meanwhile, while the BFT layer was cross-sectionally observed in a film shape, it was presumed that the island was overlapped in a depth direction (TEM sample thickness direction).

Other Embodiments

Hereinbefore, one embodiment of the invention was described, however, the invention is not limited to the embodiment described above. For example, the silicon single crystal substrate was exemplified as the channel forming substrate 10, however, is not particularly limited thereto and, for example, a material such an SOI substrate or a glass may be used.

In Embodiment 1 described above, the liquid ejecting head in which the first electrode 60 configures the individual electrode which is independently provided corresponding to the pressure generating chamber 12 and the second electrode 80 configures the common electrode which is continuously provided over the juxtaposing direction of the pressure generating chamber 12, was exemplified, however, the first electrode 60 may configure the common electrode which is continuously provided over the juxtaposing direction of the pressure generating chamber 12 and the second electrode 80 may configure the individual electrode which is independently provided corresponding to the pressure generating chamber 12.

Figure 14:
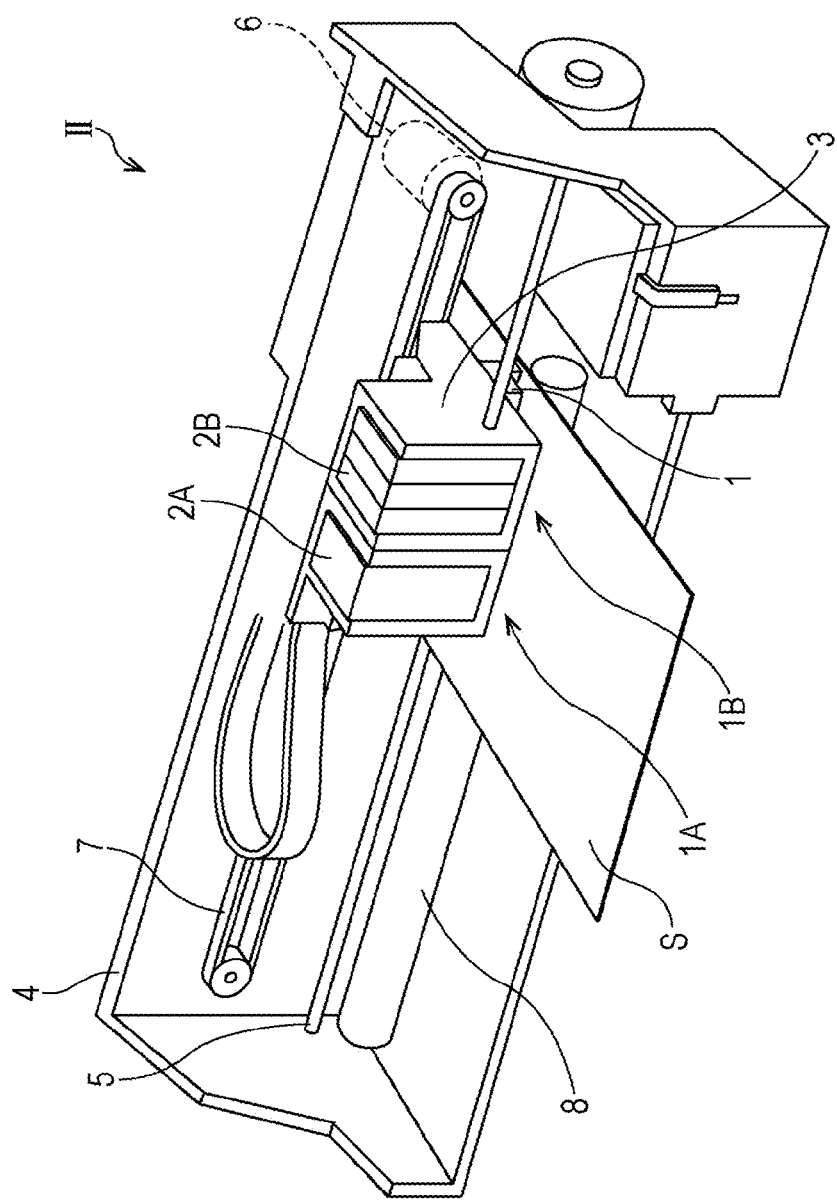
FIG. 14 is a view illustrating a schematic configuration of a recording apparatus according to an embodiment of the invention.

In addition, the ink jet type recording head I (refer to FIG. 1) is mounted on, for example, an ink jet type recording apparatus II, as shown in FIG. 14. Cartridges 2A and 2B configuring the ink supply section are detachably provided on recording head units 1A and 1B having the ink jet type recording head I and a carriage 3 mounting the recording head units 1A and 1B is movably provided in an axis direction on a carriage shaft 5 attached to an apparatus main body 4. The recording head units 1A and 1B ejects, for example, a black ink composition and a color ink composition.

Moreover, by transmitting a driving force of a driving motor 6 to the carriage 3 through a plurality of gears (not shown) and a timing belt 7, the carriage 3 mounting the recording head units 1A and 1B is moved along the carriage shaft 5. On the other hand, a transport roller 8 is provided as a transport section in the apparatus main body 4 and a recording sheet S which is a recording medium such paper is transported by the transport roller 8. Meanwhile, the transport section for transporting the recording sheet S is not limited to the transport roller and may be a belt, a drum, or the like.

Meanwhile, in the example describe above, the ink jet type recording apparatus in which the ink jet type recording head I is mounted on the carriage 3 and which is moved in a main scanning direction is exemplified as the ink jet type recording apparatus II, however, the configuration thereof is not particularly limited. The ink jet type recording apparatus II may be, for example, a so-called line type recording apparatus in which printing is performed by fixing the ink jet type recording head I and moving the recording sheet S such paper in a sub scanning direction.

Meanwhile, in the embodiment described above, while description was given by giving the ink jet type recording head I as an example of the liquid ejecting head, the invention is widely targeted at the liquid ejecting head in general and can be also naturally applied to the liquid ejecting head which ejects a liquid except an ink. As other liquid ejecting heads, for example, various kinds of recording heads used for an image recording apparatus such as a printer, a color material ejecting head used for manufacturing a color filter such as a liquid crystal display, an electrode material ejecting head used for forming an electrode of an organic EL display, an FED (field emission display), or the like, living body organic matter ejecting head used for manufacturing a biochip, and the like are included.

In addition, the piezoelectric element according to the invention is not limited to the piezoelectric element which is used for the liquid ejecting head and can be also used for other devices. As other devices, for example, an ultrasonic device such as an ultrasonic transmitter, an ultrasonic motor, a temperature-electricity convertor, a pressure-electricity convertor, a ferroelectric transistor, a piezoelectric transformer, a filter such as a blocking filter of a harmful light ray such as an infrared ray, an optical filter using an effect of a photonic crystal by forming a quantum dot, or an optical filter using the optical interference of a thin film, and the like are included. In addition, the invention can be also applied to the piezoelectric element used as a sensor and the piezoelectric element used as a ferroelectric memory. As a sensor in which the piezoelectric element is used, for example, an infrared sensor, and an ultrasonic sensor, a thermosensitive sensor, a pressure sensor, a pyroelectric sensor, a gyro sensor (an angular velocity sensor), and the like are included.

The entire disclosure of Japanese Patent Application No. 2014-071237, filed Mar. 31, 2014 is expressly incorporated by reference herein.

What is claimed is:

1. A piezoelectric element comprising:
   a first electrode;
   a seed layer comprised of a composite oxide having a perovskite structure and preferentially oriented to a (100) plane, the seed layer including bismuth in an A site and including iron and titanium in a B site, the seed layer having a thickness of less than 20 nm;
   a piezoelectric layer provided on the seed layer, the piezoelectric layer consisting of a piezoelectric material having a perovskite structure and preferentially oriented to a (100) plane; and
   a second electrode provided on the piezoelectric layer.
2. The piezoelectric element according to claim 1, wherein the seed layer is provided in an island shape.
3. The piezoelectric element according to claim 1, wherein an occupancy rate of the seed layer is 30% or more.

4. The piezoelectric element according to claim 1, wherein the first electrode includes platinum preferentially oriented to a (111) plane and a half value width of a diffraction peak derived from the (111) plane by an X-ray diffraction method is 10° or less.

5. The piezoelectric element according to claim 1, wherein a molar ratio of bismuth at the A site to iron and titanium at the B site (bismuth/(iron and titanium)) is in a range from 1.0 to 1.4.

6. The piezoelectric element according to claim 1, wherein a molar ratio of iron to titanium at the B site (iron/titanium) is in a range from 9/11 to 3.0.

7. A liquid ejecting head comprising:
the piezoelectric element according to claim 1.

8. A liquid ejecting apparatus comprising:
the liquid ejecting head according to claim 7.

9. A sensor comprising:
the piezoelectric element according to claim 1.

* * * * *